United States Patent
Kuroki et al.

(10) Patent No.: US 7,944,262 B2
(45) Date of Patent: May 17, 2011

(54) DUTY CORRECTION CIRCUIT

(75) Inventors: Koji Kuroki, Tokyo (JP); Yasuhiro Takai, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/453,652

(22) Filed: May 18, 2009

(65) Prior Publication Data
US 2009/0289679 A1 Nov. 26, 2009

(30) Foreign Application Priority Data
May 21, 2008 (JP) ................................ P2008-133113

(51) Int. Cl.
*H03K 3/017* (2006.01)
(52) U.S. Cl. ........................................ 327/175; 327/172
(58) Field of Classification Search .................. None
See application file for complete search history.

(56) References Cited

U.S. PATENT DOCUMENTS
6,198,322 B1  3/2001 Yoshimura
6,940,328 B2 * 9/2005 Lin ............................... 327/175

FOREIGN PATENT DOCUMENTS
JP         2000-68797         3/2000
* cited by examiner

*Primary Examiner* — Cassandra Cox
(74) *Attorney, Agent, or Firm* — McGinn IP Law Group, PLLC

(57) ABSTRACT

A duty correction circuit is formed using at least one delay circuit, which is constituted of a first inverter including three transistors of different conduction types and a second inverter including three other transistors of different conduction types and which delays and adjusts an input clock signal at the leading-edge/trailing-edge timing so as to convert it into an output clock signal based on a first or second bias voltage produced by a bias circuit detecting the duty ratio of the output clock signal. The duty correction circuit decreases the high-level period of the output clock signal having a high duty ratio based on the first bias voltage. Alternatively, the duty correction circuit increases the high-level period of the output clock signal having a low duty ratio based on the second bias voltage.

16 Claims, 8 Drawing Sheets

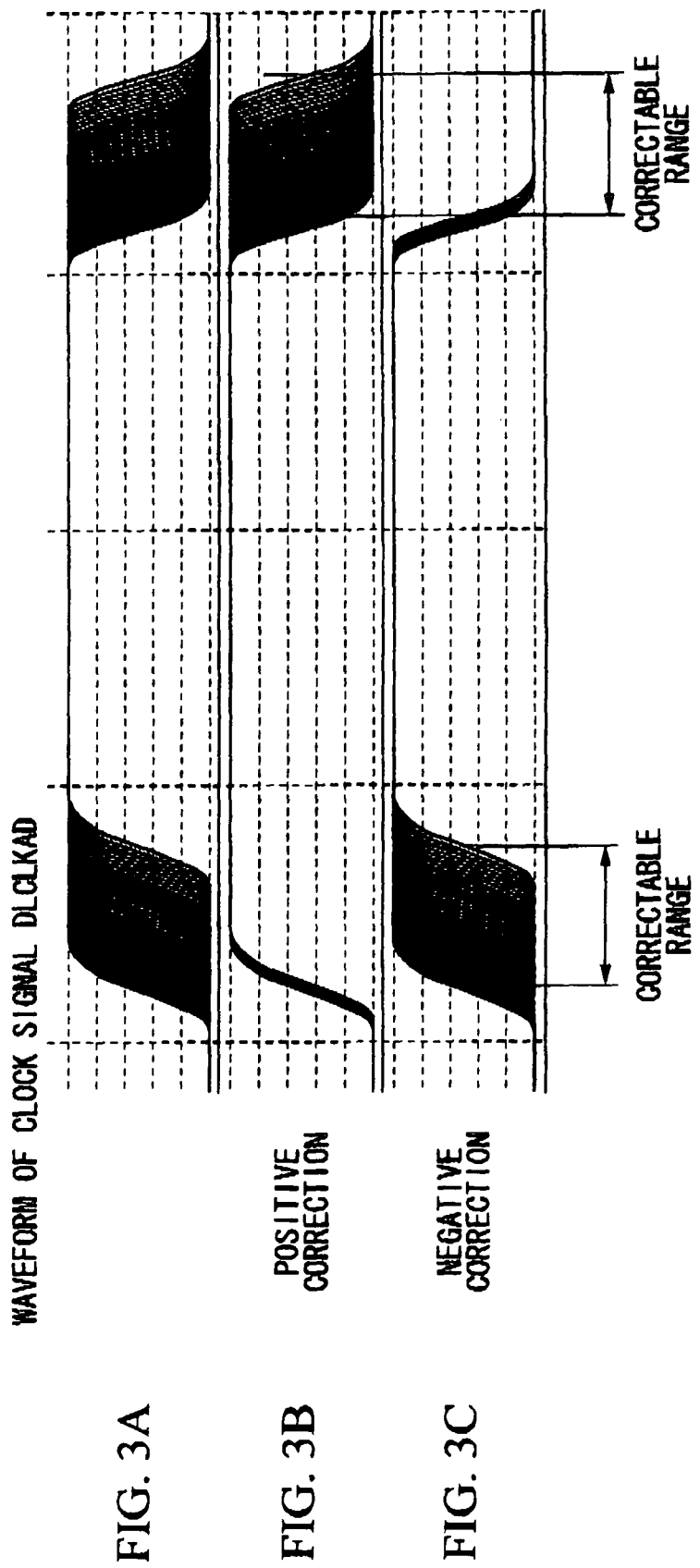

DUTY CORRECTION CIRCUIT

BACKGROUND OF THE INVENTION

1. Field of the Invention

The present invention relates to duty correction circuits which correct duty ratios of clock signals generated by frequency dividers adapted to digital circuits.

The present application claims priority on Japanese Patent Application No. 2008-133113, the content of which is incorporated herein by reference.

2. Description of Related Art

Conventionally, various technologies for controlling duty ratios of clock signals in synchronization with timings for transmitting signals between digital circuits have been developed and disclosed in various documents such as Patent Document 1.

Patent Document 1: Japanese Unexamined Patent Application Publication No. 2000-68797

For example, synchronization circuits used for synchronization of circuit operations need to set duty ratios of signals in circuits to 50%.

FIG. 8 shows a timing control circuit incorporated in a duty ratio correction circuit disclosed in Patent Document 1, wherein an inverter including a P-channel MOS transistor (hereinafter, simply referred to as a PMOS transistor) MP1 and an N-channel MOS transistor (hereinafter, simply referred to as an NMOS transistor) MN1 is associated with PMOS transistors MP2 and MP3 and NMOS transistors MN2 and MN3 so as to adjust and correct the duty ratio of an input signal S6, thus outputting an output signal S10, which is controlled at the leading-edge timing, to an inverting input terminal of a comparator A1 via a capacitor C1.

In order to adjust the duty ratio of the inverter shown in FIG. 8, the PMOS transistors MP2 and MP3 are connected in parallel between the source of the PMOS transistor MP1 and the power-supply voltage VDD while the NMOS transistors MN2 and MN3 are connected in parallel between the source of the NMOS transistor MN1 and the ground GND.

A constant bias voltage VBP is supplied to the gates of the PMOS transistors MP2 and MP3, while a constant bias voltage VBN is supplied to the gate of the NMOS transistor MN2. Electric charge is accumulated in the capacitor C1 due to a constant current flowing through the PMOS transistor MP1.

A control signal S9 is supplied to the gate of the NMOS transistor MN3 so as to control the leading-edge timing. A current flowing through the NMOS transistor MN3 varies depending upon the potential of the control signal S9, thus adjusting the trailing-edge timing of the output signal S10 of the inverter. The comparator A1 compares the output signal S10 with a reference voltage Vref (supplied to the noninverting input terminal thereof), thus adjusting the duty ratio.

Due to recent trends in increasing processing speeds of semiconductor devices, i.e. due to increasing high-speed clocking, it is necessary to secure high-speed adjustment on waveforms of clock signals in short clock periods.

Even though duty correction circuits are developed to precisely adjust duty ratios to desired values in manufacturing stages of semiconductor devices, transistor characteristics may not be normally fixed to design values due to dispersions of manufacturing processes; hence, it is very difficult to adjust duty ratios to desired values.

In the above, it is necessary for manufacturers to check and revise conditions of manufacturing processes and to make transistor characteristics suit manufacturing processes, so that semiconductor devices are property re-manufactured.

The present inventors have recognized that, in the duty ratio correction circuit of FIG. 8 disclosed in Patent Document 1 in which the duty ratio of an input signal is adjusted using PMOS transistors and NMOS transistors, when NMOS transistors are re-adjusted in characteristics due to revised manufacturing processes, PMOS transistors must be correspondingly varied in characteristics in association with NMOS transistors; hence, it is very difficult to precisely adjust the duty ratio because both the PMOS transistors and NMOS transistors cannot be simultaneously subjected to high-precision controlling of characteristics thereof.

SUMMARY

The invention seeks to solve the above problem, or to improve upon the problem at least in part.

In one embodiment of the present invention, a duty correction circuit is constituted of a first inverter including a first transistor, a second transistor, and a third transistor of different conduction types, wherein the first transistor whose gate receives an input clock signal is connected between a first-voltage (e.g. a power-supply voltage) and a first output terminal, the second transistor whose gate receives an input clock signal is connected to a second voltage (e.g. a ground potential), and the third transistor is connected in series to the first transistor in connection with the first output terminal; a second inverter including a fourth transistor, a fifth transistor, and a sixth transistor of different conduction types, wherein the fourth transistor whose gate is connected to the first output terminal is connected between the first voltage and a second output terminal, the fifth transistor whose gate is connected to the first output terminal is connected to the second voltage, and the sixth transistor is connected in series to the fourth transistor in connection with the second output terminal; and a bias circuit that supplies a first bias voltage to the gate of the third transistor and that supplies a second bias voltage to the gate of the sixth transistor. That is, the input clock signal is delayed by the first inverter and the second inverter in turn and is converted into an output clock signal, whose duty ratio is corrected based on the first bias voltage or the second bias voltage and which is output from the second output terminal.

In another embodiment of the present invention, a duty correction circuit is constituted of a plurality of delay circuits which are coupled together in a cascade-connection manner so as to convert an input clock signal into an output clock signal; a duty detection circuit detecting a duty ratio of the output clock signal; and a bias circuit supplying a first bias voltage or a second bias voltage to each of the delay circuits based on the detection result of the duty detection circuit. Each of the delay circuits includes the first inverter having the first, second, and third transistors, and the second inverter having the fourth, fifth, and sixth transistors.

The present invention demonstrates the following effects.

(1) Due to the insertion of the third and sixth transistors whose conduction types are identical to or different from the conduction types of the first and fourth transistors or the conduction type of the second and fifth transistors, it is possible to precisely adjust the delay time applied to the input clock signal irrespective of variations of characteristics of transistors due to dispersions and/or modifications of manufacturing processes; hence, it is possible to precisely correct the duty ratio to a desired value.

(2) When the input clock signal is delayed via multiple stages of delay circuits in which each stage is reduced in the correction value (i.e. the delay time) thereof, it is possible to secure the overall correction value corresponding to the sum of correction values, thus achieving a broad correctable range for adjusting the leading-edge timing and/or the trailing-edge timing with respect to the output clock signal.

BRIEF DESCRIPTION OF THE DRAWINGS

The above features and advantages of the present invention will be more apparent from the following description of certain preferred embodiments taken in conjunction with the accompanying drawings, in which:

FIG. 3A is a graph used for explaining a time adjustment on a high-level period of a clock signal DLCLKAD output from delay circuits included in the duty correction circuit shown in FIG. 1;

FIG. 3B is a graph used for explaining a positive correction effected on the clock signal DLCLKAD;

FIG. 3C is a graph used for explaining a negative correction effected on the clock signal DLCLKAD;

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
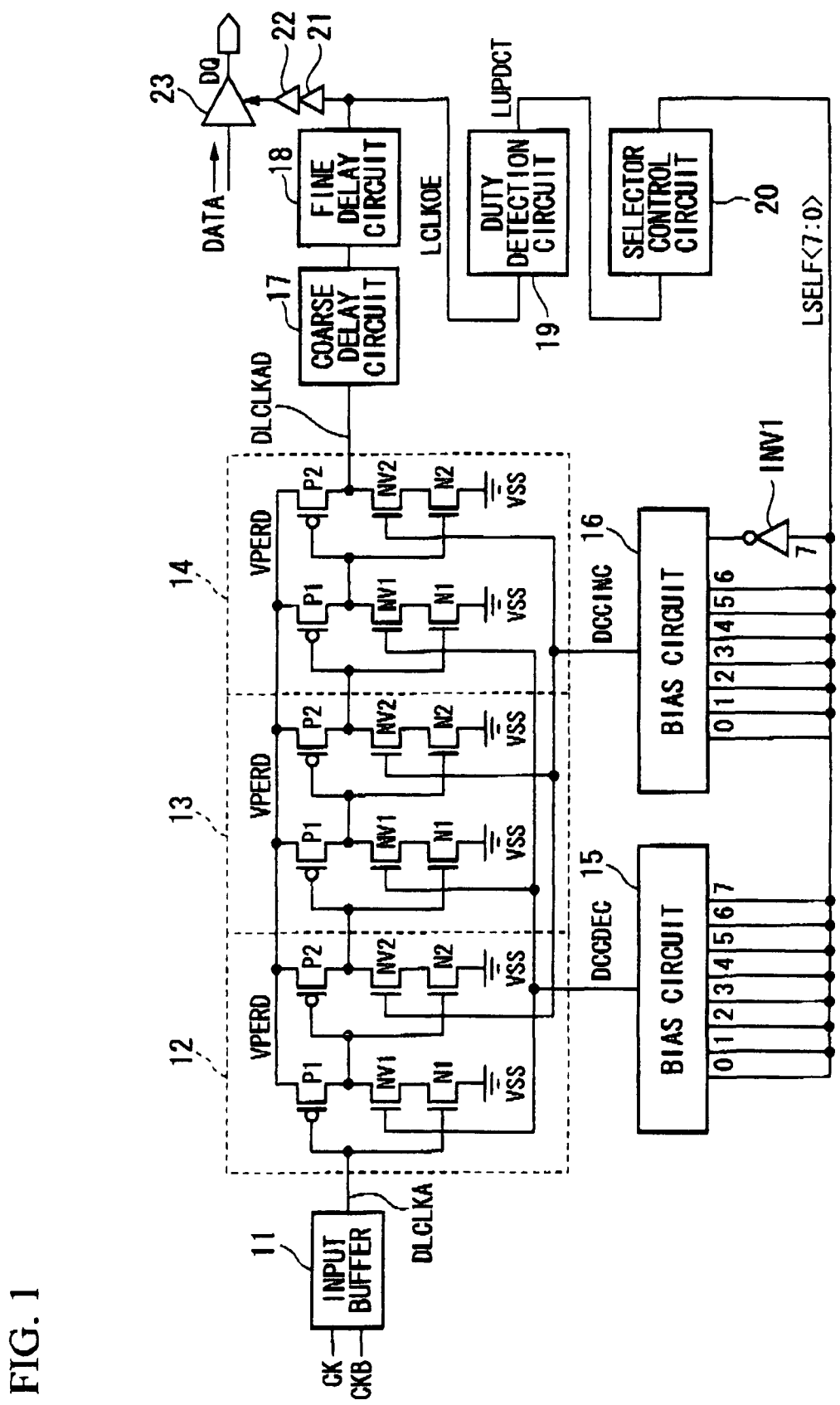
FIG. 1 is a block diagram showing the constitution of a duty correction circuit according to a first embodiment of the present invention.

FIG. 1 is a block diagram showing a duty correction circuit according to a first embodiment of the present invention.

The duty correction circuit of FIG. 1 includes an input buffer 11, delay circuits 12, 13, and 14, bias circuits 15 and 16, a coarse delay circuit 17, a fine delay circuit 18, a duty detection circuit 19, a selector control circuit 20, buffers 21, 22, and 23, and an inverter INV1.

The input buffer 11 receives a clock signal CK and an inverse clock signal CKB (whose phase is inverse to the phase of the clock signal CK) which are generated by way of oscillation of an external oscillator (not shown), thus producing a clock signal DLCLKA.

Each of the delay circuits 12, 13, and 14 has a double-stage configuration including a first inverter and a second inverter.

The first inverter is constituted of a PMOS transistor P1 and NMOS transistors NV1 and N1. The source of the PMOS transistor P1 is connected to a power-supply voltage VPERD, the gate thereof receives the clock signal DLCLKA, and the drain thereof is connected to the drain of the NMOS transistor NV1. The gate of the NMOS transistor NV1 receives a control signal DCCDEC having a bias voltage VDEC, and the source thereof is connected to the drain of the NMOS transistor N1. The gate of the NMOS transistor N1 receives the clock signal DLCLKA, and the source thereof is connected to a ground potential VSS.

The second inverter is constituted of a PMOS transistor P2 and NMOS transistors NV2 and N2. The source of the PMOS transistor P2 is connected to the power-supply voltage VPERD, the gate thereof is connected to the drain of the PMOS transistor P1 (corresponding to the output terminal of the first inverter), and the drain thereof is connected to the drain of the NMOS transistor NV2. The gate of the NMOS transistor NV2 receives a control signal DCCINC having a bias voltage VINC, and the source thereof is connected to the drain of the NMOS transistor N2. The gate of the NMOS transistor N2 is connected to the drain of the PMOS transistor P1, and the source thereof is connected to the ground potential VSS.

The bias circuit 15 produces the control signal DCCDEC having the bias voltage DDEC selected by a select signal LSELF<7:0>, thus outputting it to the gates of the NMOS transistors NV1 included in the delay circuits 12, 13, and 14.

The bias circuit 16 produces the control signal DCCINC having the bias voltage VINC selected by the select signal LSELF<7:0>, thus outputting it to the gates of the NMOS transistors NV2 included in the delay circuits 12, 13, and 14.

The select signal LSELF<7:0> is constituted of signal lines LSELF<0>, LSELF<1>, LSELF<2>, LSELF<3>, LSELF<4>, LSELF<5>, LSELF<6>, and LSELF<7>, wherein the signal line LSELF<7> designates a select signal for activating either the bias circuit 15 or the bias circuit 16.

Figure 2:
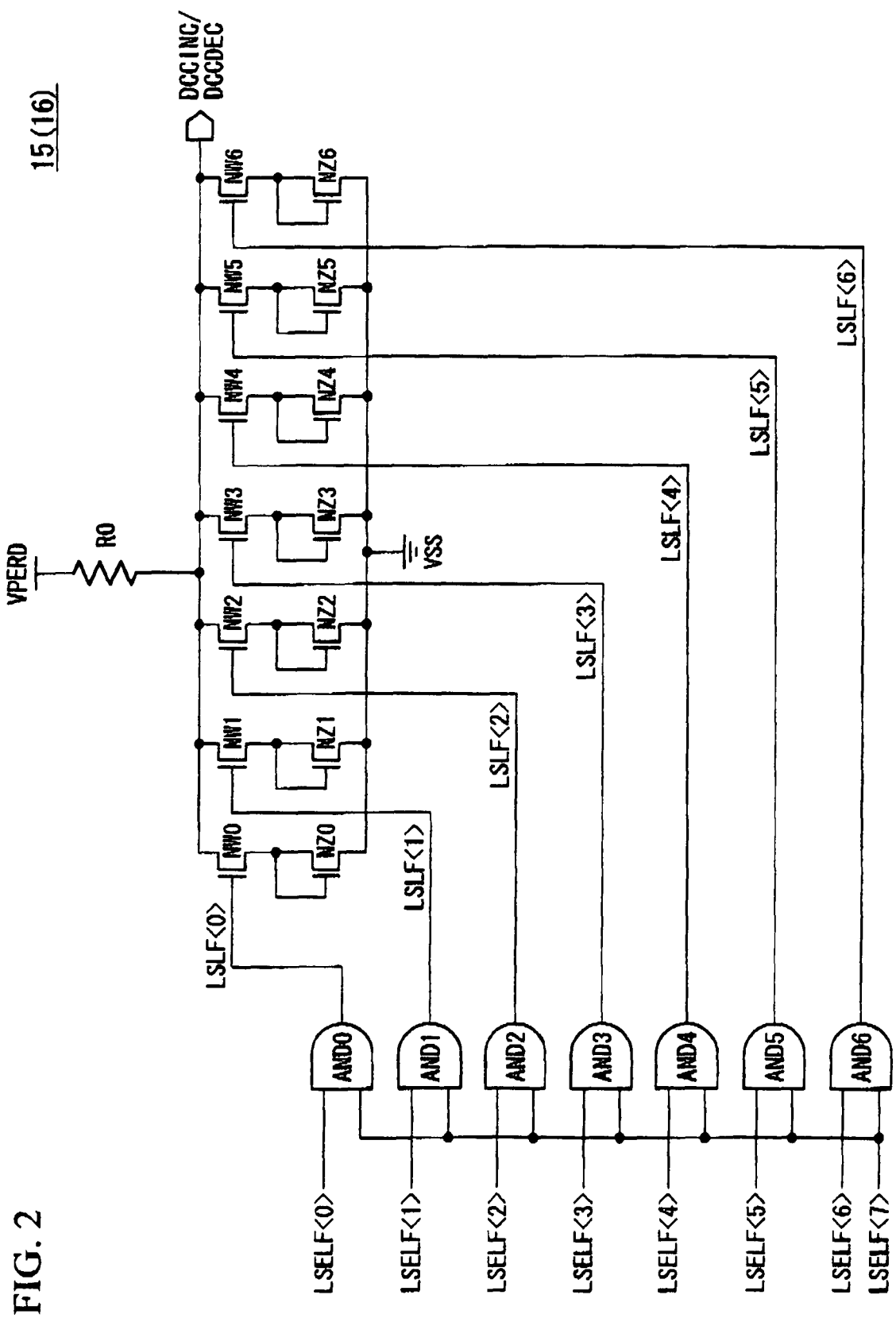
FIG. 2 is a circuit diagram showing the constitution of a bias circuit included in the duty correction circuit shown in FIG. 1.

As shown in FIG. 2, the bias circuits 15 and 16 are each constituted of double-input-type AND circuits AND0, AND1, AND2, AND3, AND4, AND5, and AND6, NMOS transistors NW0, NW1, NW2, NW3, NW4, NW5, and NW6, and NMOS transistors NZ0, NZ1, NZ2, NZ3, NZ4, NZ5, and NZ6.

A plurality of transistor pairs (each consisting of two NMOS transistors coupled in series) is formed using NW0 and NZ0, NW1 and NZ1, NW2 and NZ2, NW3 and NZ3, NW4 and NZ4, NW5 and NZ5, and NW6 and NZ6.

For an example, the transistor pair consisting of the NMOS transistors NW0 and NZ0 will be illustrated as follows:

The drain of the NMOS transistor NW0 is connected to the power-supply voltage VPERD via a resistor R0, and the gate thereof is connected to the output terminal of the AND circuit AND0 outputting the select signal LSELF<0>. The drain of the NMOS transistor NZ0 is connected to the source of the NMOS transistor NW0, the gate thereof is connected to the drain thereof, and the source thereof is connected to the ground potential VSS. In this transistor pair, the NMOS transistor NW0 is turned on when the select signal LSELF<0> is high, thus allowing a current to flow through the NMOS transistor NZ0.

The above connection manner of the transistor pair consisting of NW0 and NZ0 is similarly applied to the transistor pair consisting of NW1 and NZ1, the transistor pair consisting of NW2 and NZ2, the transistor pair consisting of NW3 and NZ3, the transistor pair consisting of NW4 and NZ4, the transistor pair consisting of NW5 and NZ5, and the transistor pair consisting of NW6 and NZ6, in which the NMOS transistors NW1, NW2, NW3, NW4, NW5, and NW6 are each turned on or off in response to the select signals LSELF<1>, LSELF<2>, LSELF<3>, LSELF<4>, LSELF<5>, and LSELF<6>.

The sizes of the NMOS transistors NW0-NW6 and NZ0-NZ6 are determined such that the ratio of currents flowing through NW0 and NZ0, NW1 and NZ1, NW2 and NZ2, NW3 and NZ3, NW4 and NZ4, NW5 and NZ5, and NW6 and NZ6 is set to 1:2:4:8:16:32:64.

In FIG. 2, all the transistor pairs consisting of NW0 and NZ0, NW1 and NZ1, NW2 and NZ2, NW3 and NZ3, NW4 and NZ4, NW5 and NZ5, and NW6 and NZ6 are connected in parallel while they are each connected in series between the resistor R0 (having a resistance r0 connected with the power-supply voltage VPERD) and the ground potential VSS.

Based on the combination of the NMOS transistors NW0, NW1, NW2, NW3, NW4, NW5, and NW6 which are respectively turned on, it is possible to provide 128 stages of resistance with respect to a variable resistance r1 which is presumably formed by connecting the transistor pairs in parallel.

Both of the bias voltage VINC of the control signal DCCINC and the bias voltage VDEC of the control signal DCCDEC are set to the same value calculated by the following mathematical expression.

$$(VPERD - Vtn) \times \frac{r1}{r0 + r1}$$

That is, the bias circuits 15 and 16 produce the following bias voltage.

$$VPERD - (VPERD - Vtn) \times \frac{m}{n}$$

In the above, Vtn denotes a threshold voltage of each NMOS transistor; n denotes the total number of stages of the variable resistance r1, i.e. "128" in the present embodiment; and m denotes the number of stages for varying the current ratio using the NMOS transistors being turned off. For example, when the NMOS transistors NW0, NW1, and NW2 are turned off while the NMOS transistors NW3, NW4, NW5, and NW6 are turned on, the bias voltage is calculated as follows:

$$VPERD - (VPERD - Vtn) \times \frac{7}{127}$$

When all the NMOS transistors NW0 to NW6 are turned off so that the longest delay time is applied to the trailing edge of a high-level pulse via the inverter of the delay circuit, the bias voltage is calculated as follows:

$$VPERD - (VPERD - Vtn) \times \frac{127}{127}$$

When all the NMOS transistors NW0 to NW6 are turned off so that the shortest delay time is applied to the trailing edge of a high-level pulse via the inverter of the delay circuit, the bias voltage is approximately set to VPERD.

The select signal LSELF<7> is directly supplied to the AND circuits AND0 to AND6 included in the bias circuit 1, while the select signal LSELF<7> is inverted by the inverter INV1 and is then supplied to the AND circuit AND0 to AND6 included in the bias circuit 16. In the bias circuit 15, the AND circuits AND0 to AND 6 output the select signals LSELF<0> to LSELF<6> in a high-level period of the select signal LSELF<7>, while they normally outputs low-level signals in a low-level period of the select signal LSELF<7> irrespective of the select signals LSELF<0> to LSELF<6>.

For example, in the high-level period of the select signal LSELF<7>, the AND circuit AND0 allows the select signal LSELF<0> having a high level or a low level to transmit therethrough. Similarly, in the high-level period of the select signal LSELF<7>, the AND circuits AND1 to AND6 allows the select signals LSELF<1> to LSELF<6> each having a high level or a low level to transmit therethrough.

When the high-level period of the clock signal DLCLKA is longer than the low-level period thereof, the bias circuit 15 outputs the control signal DCCDEC, whose bias voltage VDEC is determined to decrease the high-level period of the clock signal DLCLKA, to the gates of the NMOS transistors NV1 included in the delay circuits 12 to 14.

When the high-level period of the clock signal DLCLKA is shorter than the low-level period thereof, the bias circuit 16 outputs the control signal DCCINC, whose bias voltage VINC is determined to increase the high-level period of the clock signal DLCLKA, to the gates of the NMOS transistors NV2 included in the delay circuits 12 to 14.

The coarse delay circuit 17 adjusts the phase of the clock signal DLCLKAD, which is adjusted in waveform compared to the clock signal DLCLKA and is output from the delay circuit 14, without varying the waveform thereof.

Similar to the coarse delay circuit 17, the fine delay circuit 18 adjusts the phase of the clock signal DLCLKAD without varying the waveform thereof. Specifically, the fine delay circuit 18 adjusts the phase of the clock signal DLCLKAD in units of fine durations which are smaller than durations of the coarse delay circuit 17, thus producing a clock signal LCLKOE.

Based on measurements results produced beforehand, the delay times used in the coarse delay circuit 17 and the fine delay circuit 18 are adjusted such that the phase of the clock signal LCLKOE (which will be supplied to the buffer 23 via the buffers 21 and 22) matches the phase of the clock signal CK.

The duty detection circuit 19 detects a duty ratio between the high-level period and the low-level period in the clock signal LCLKOE, thus producing difference data LUPDCT (having a positive/negative polarity) representing the time difference between the high-level period and the low-level period.

Specifically, the duty detection circuit 19 includes an oscillator for generating an internal clock signal whose period is shorter than the period of the clock signal CK so as to count the number of high-level pulses occurring in the high-level period per one cycle or plural cycles and the number of low-level pulses occurring in the low-level period per one cycle or plural cycles, wherein the number of low-level pulses is subtracted from the number of high-level pulses so as to produce the difference data LUPDCT having a positive/negative polarity.

The selector circuit 20 extracts the polarity from the difference data LUPDCT of the duty detection circuit 19, wherein in the case of a positive polarity indicating that the high-level period is longer than the low-level period, the selector circuit 20 produces the control signal LSELF<7:0> including the select signal LSELF<7> which is set to a high level so as to perform a negative correction for decreasing the high-level period of the clock signal LCLKOE.

When the selector circuit 20 extracts from the difference data LUPDCT a negative polarity indicating that the high-level period is shorter than the low-level period, the selector circuit 20 produces the control signal LSELF<7:0> including the select signal LSELF<7> which is set to a low level so as to perform a positive correction for increasing the high-level period of the clock signal LCLKOE.

The selector circuit 20 determines the number of transistors pairs which should be turned on in the bias circuits 15 and 16 based on the number of pulses included in the difference data LUPDCT. For example, the number of pulses in the difference data LUPDCT is classified into 128 combinations of transistor pairs whose NMOS transistors are turned on. The selector circuit 20 selects one of the 128 combinations of transistor pairs in correspondence with the number of pulses in the difference data LUPDCT, thus producing the control signal LSELF<7:0> for turning on the prescribed transistor pairs, the combination of which is selected by the number of pulses in the difference data LUPDCT. Thus, the bias circuit 15 varies the bias voltage VDEC of the control signal DCCDEC in 128 stages of voltage ranging from "VPERD−(VPERD−Vtn)×0/127" to "VPERD−(VPERD−Vtn)×127/127". Similarly, the bias circuit 16 varies the bias voltage VINC of the control signal VCCINC in the 128 stages of voltage.

The clock signal LCLKOE output from the fine delay circuit 18 is supplied to the control terminal of the buffer 23 via the buffers 21 and 22.

In the high-level period of the clock signal LCLKOE, the buffer 23 allows input data (given from an external circuit) to transmit toward an external device (not shown).

Next, the operation of the duty correction circuit shown in FIGS. 1 and 2 will be described with reference to FIGS. 3A to 3C for illustrating correctable ranges of duty ratios, wherein the vertical axis represents the signal intensity, and the horizontal axis represents the time.

When the high-level period of the clock signal LCKLOE is longer than the low-level period thereof, the duty detection circuit 19 subtracts the number of pulses occurring in the low-level period from the number of pulses occurring in the high-level period. For example, the duty detection circuit 19 produces the difference data LUPDCT indicating a difference value q accompanied with a positive polarity, which is supplied to the selector control circuit 20.

The selector control circuit 20 detects either a positive polarity or a negative polarity is attached to the difference data LUPDCT, wherein in the case of the positive polarity, the selector control circuit 20 sets up the select signal LSELF<7>=1. In addition, when the difference value q indicates m/n=93/127 in connection with "VPERD−(VPERD−Vtn)×m/n", the selector control circuit 20 sets the select signals LSELF<0> and LSELF<5> to a high level, thus controlling the bias circuit 15 to produce the control signal DCCDEC having the bias voltage VDEC of "VPERD−(VPERD−Vtn)×93/127". That is, the selector control circuit 20 produces the control signal LSELF<7:0>=LSELF (LSELF<7>, LSELF<6>, LSELF<5>, LSELF<4>, LSELF<3>, LSELF<2>, LSELF<1>, LSELF<0>)=#A1 (where # represents hexadecimal notation), wherein LSELF<7> denotes the most significant bit, and LSELF<0> denotes the least significant bit.

Upon reception of the control signal LSELF<7:0 >=#A1 from the selector control circuit 20, the bias circuit 15 activates the AND circuits AND0 to AND6 thereof because the select signal LSELF<7> is at a high level.

In the above, the select signals LSELF<0> and LSELF<5> are at a high level while the other select signals LSELF<1>, LSELF<2>, LSELF<3>, LSELF<4>, and LSELF<6> are at a low level, wherein the AND circuits AND0 and AND5 transmit the select signals LSELF<0> and LSELF<5> each having a high level therethrough while the other AND circuits AND1, AND2, AND3, AND4, and AND6 transmit the select signals LSELF<1>, LSELF<2>, LSELF<3>, LSELF<4>, and LSELF<6> each having a low level therethrough. In the bias circuit 15, the bias voltage VDEC is controlled based on the above select signals LSELF<0> to LSELF<6>.

Since the select signal LSELF<7> is inverted by the inverter INV1, the bias circuit 16 receives the control signal LSELF<7:0>=#21 so as to inactivate all the AND circuits AND0 to AND6 thereof, which in turn transmit the select signals LSELF<0> to LSELF<6> each having a low level therethrough.

In the above condition, the NMOS transistors NW0 and NW5 are turned on so that both the transistor pair consisting of NW0 and NZ0 and the transistor pair consisting of NW5 and NZ5 are turned on in the bias circuit 15, which thus produces the control signal DCCDEC having the bias voltage VDEC of "VPERD−(VPERD−Vtn)×93/127".

Thus, the bias voltage VDEC of "VPERD−(VPERD−Vtn)×93/127" is supplied to the gates of the NMOS transistors NV1 included in the first inverters of the delay circuits 12, 13, and 14.

The present embodiment is designed such that a single stage of the first inverter causes a one-step change in the number of pulses by way of the time adjustment using a step time Δt for the clock signal DLCLKA. Since the duty correction circuit of FIG. 3 includes three stages of the first inverters included in the delay circuits 12, 13, and 14, it is possible to decrease the high-level period of the clock signal DLCLKA with the total time of 33×3×Δt by way of the negative correction; then, the clock signal DCLKAD subjected to the time adjustment is output from the delay circuit 14.

All the transistor pairs are turned off in the bias circuit 16, which thus produces the control signal DCCINC whose bias voltage VINC is approximately equal to VPERD, wherein the second inverters included in the delay circuits 12 to 14 are not contributed to the time adjustment on the high-level period of the clock signal DLCLKA.

Since the current flowing through the NMOS inverter NV1 of the first inverter is adjusted based on the bias voltage VDEC of the control signal DCCDEC and is thus decreased in comparison with original one based on the power-supply voltage VPERD, the leading-edge timing of the output signal of the first inverter is not changed but the trailing-edge timing thereof is delayed.

In the above, the waveform of the output signal of the first inverter is inverted by the second inverter so that the trailing-edge timing of the high-level period output from the delay circuit is not changed but the leading-edge timing thereof is delayed by way of the negative correction shown in FIG. 3C, whereby it is possible to substantially decrease the high-level period of the clock signal DLCLKAD.

Since the present embodiment is designed to inhibit the delay circuits 12 to 14 from causing a delay time corresponding to the control signal LSELF<7:0>=#80, it is possible to increase the correctable range shown in FIGS. 3A to 3C up to a delay time corresponding to the control signal LSELF<7:0>=#FF, i.e. 128×3×Δt.

When the high-level period of the clock signal LCLKOE is shorter than the low-level period thereof, the duty detection circuit 19 subtracts the number of pulses in the low-level period from the number of pulses in the high-level period, thus producing the difference data LUPDCT indicating the difference value q accompanied with a negative polarity.

The selector control circuit 20 detects either the positive polarity or the negative polarity is attached to the difference data LUPDCT, wherein in the case of the negative polarity, the selector control circuit 20 sets up the select signal LSELF<7>=0. In addition, when the difference value q indicates m/n=93/127 in connection with "VPERD−(VPERD−Vtn)×m/n", the selector control circuit 20 sets the select signals LSELF<0> and LSELF<5> to a high level, thus controlling the bias circuit 16 to produce the control signal DCCINC having the bias voltage VINC of "VPERD−(VPERD−Vtn)×93/127". That is, the selector control circuit 20 produces the control signal LSELF<7:0>=LSELF (LSELF<7>, LSELF<6>, LSELF<5>, LSELF<4>, LSELF<3>, LSELF<2>, LSELF<1>, LSELF<0>)=#21.

Upon reception of the control signal LSELF<7:0> together with the select signal LSELF<7>=0, the bias circuit 15 inactivates the AND circuits AND0 to AND6, which thus transmit the select signals LSELF<0> to LSELF<6> each having a low level.

In the above, the select signals LSELF<0> and LSELF<5> are at a high level while the other select signals LSELF<1>, LSELF<2>, LSELF<3>, LSELF<4>, and LSELF<6> are at a low level, wherein the AND circuits AND0 and AND5 transmit the select signals LSELF<0> and LSELF<5> each having a high level therethrough while the other AND circuits AND1, AND2, AND3, AND4, and AND6 transmit the select signals LSELF<1>, LSELF<2>, LSELF<3>, LSELF<4>, and LSELF<6> each having a low level therethrough. In the bias circuit 16, the bias voltage VINC is controlled based on the above select signals LSELF<0> to LSELF<6>.

In the above condition, the NMOS transistors NW0 and NW5 are turned on so that both the transistor pair consisting of NW0 and NZ0 and the transistor pair consisting of NW5 and NZ5 are turned on in the bias circuit 16, which thus produces the control signal DCCINC having the bias voltage VINC of "VPERD−(VPERD−Vtn)×93/127".

Thus, the bias voltage VDEC of "VPERD−(VPERD−Vtn)×93/127" is supplied to the gates of the NMOS transistors NV2 included in the second inverters of the delay circuits 12, 13, and 14.

The present embodiment is designed such that a single stage of the second inverter causes a one-step change in the number of pulses by way of the time adjustment using a step time Δt for the clock signal DLCLKA. Since the duty correction circuit of FIG. 3 includes three stages of the first inverters included in the delay circuits 12, 13, and 14, it is possible to increase the high-level period of the clock signal DLCLKA with the total time of 33×3×Δt by way of the positive correction; then, the clock signal DCLKAD subjected to the time adjustment is output from the delay circuit 14.

All the transistor pairs are turned off in the bias circuit 15, which thus produces the control signal DCCDEC whose bias voltage VDEC is approximately equal to VPERD, wherein the first inverters included in the delay circuits 12 to 14 are not contributed to the time adjustment on the high-level period of the clock signal DLCLKA.

Since the current flowing through the NMOS inverter NV2 of the second inverter is adjusted based on the bias voltage VINC of the control signal DCCINC and is thus decreased in comparison with original one based on the power-supply voltage VPERD, the leading-edge timing of the output signal of the first inverter is not changed but the trailing-edge timing thereof is delayed.

The delay circuit outputs the output waveform of the second inverter such that the leading-edge timing of the high-level period is not changed but the trailing-edge timing thereof is delayed by way of the positive correction shown in FIG. 3B, whereby it is possible to substantially increase the high-level period of the clock signal DLCLKAD.

Since the present embodiment is designed to inhibit the delay circuits 12 to 14 from causing a delay time corresponding to the control signal LSELF<7:0>=#80, it is possible to increase the correctable range shown in FIGS. 3A to 3C up to a delay time corresponding to the control signal LSELF<7:0>=#FF, i.e. 128×3×Δt.

When the number of pulses occurring in the high-level period of the clock signal LCLKOE is identical to the number of pulses occurring in the low-level period, the duty detection circuit 19 subtracts the number of pulses in the low-level period from the number of pulses in the high-level period, thus producing the difference data LUPDCT indicating the difference value q accompanied with a positive polarity.

The selector control circuit 20 detects either the positive polarity or the negative polarity is attached to the difference data LUPDCT. In this case, the selector control circuit 20 detects the difference number q=0 accompanied with the positive polarity; hence, the selector control circuit 20 outputs the select signal LSELF<7>=1 together with the control signal LSELF<7:0>=#80 including the select signals LSELF<0> to LSELF<6> each having a low level, thus controlling the bias circuit 15 to produce the control signal DCCDEC having the bias voltage VDEC=VPERD.

Due to the select signal LSELF<7>=1, the bias circuit 15 activates the AND circuits AND0 to AND6 based on the control signal LSELF<7:0>=#80.

In the bias circuit 15, the AND circuits AND0 to AND6 transmit the select signals LSELF<0> to LSELF<6> each having a low level therethrough.

Since the select signal LSELF<7> is inverted by the inverter INV1, the bias circuit 16 inactivates the AND circuits AND0 to AND6, which thus transmit the select signals LSELF<0> to LSELF<6> each having a low level therethrough based on the LSELF<7:0>=#80.

Since all the NMOS transistors NW0 to NW6 are turned off, the bias circuit 15 produces the control signal DCCDEC having the bias voltage VDEC=VPERD.

Since the bias voltage VDEC=VPERD is supplied to the gates of the NMOS transistors NV1 included in the first inverters of the delay circuits 12, 13, and 14, the first inverters do not cause any delay time on the high-level period of the clock signal DLCLKA.

Since all the NMOS transistors NW0 to NW6 are turned off, the bias circuit 16 produces the control signal DCCINC having the bias voltage VINC=VPERD, the second inverts do not cause any delay time on the high-level period of the clock signal DLCLKA.

As described above, both the first inverters and the second inverters do not cause any delay time at the trailing-edge timing of the high-level period of the clock signal DLCLKA, so that the clock signal DLCLKA is not adjusted in the high-level period thereof and is directly output from the delay circuit 14 as the clock signal DLCLKAD.

It is possible to redesign the first inverters of the delay circuits 12, 13, and 14 such that the NMOS transistor N1 and the NMOS transistor NV1 (for adjusting the current flowing through the first inverter) are reversed in positioning in the series connection. Similarly, it is possible to redesign the second inverters of the delay circuits 12, 13, and 14 such that the NMOS transistor N2 and the NMOS transistor NV2 (for adjusting the current flowing through the second inverter) are reversed in positioning in the series connection.

Figure 9:
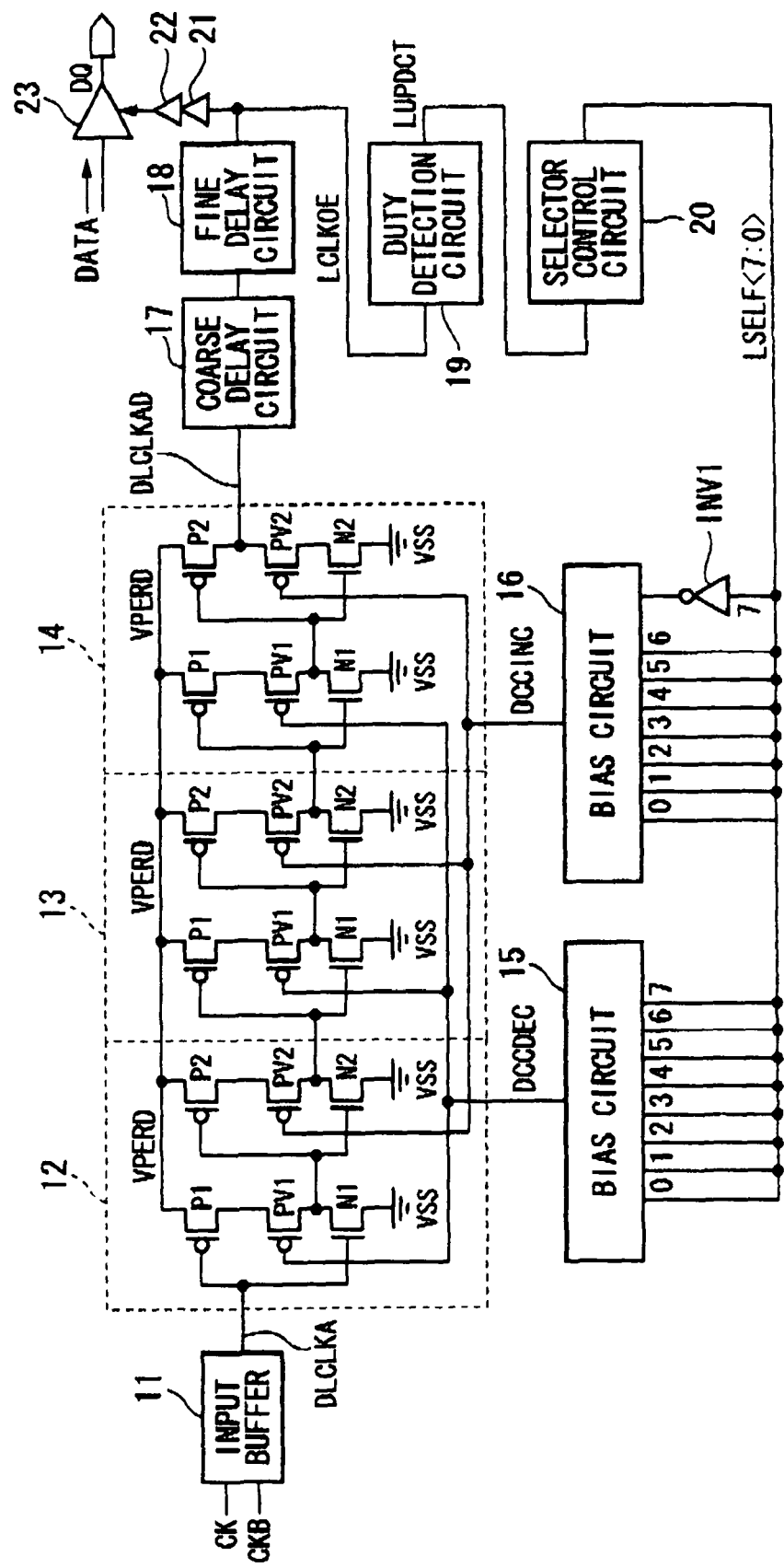
FIG. 9 is a block diagram showing a variation of the first embodiment shown in FIG. 1, in which NMOS transistors NV1 and NV2 are replaced with PMOS transistors PV1 and PV2.

As show in FIG. 9, it is possible to modify the present embodiment to use PMOS transistors PV1 and PV2 instead of the NMOS transistors NV1 and NV2, wherein the first inverter is constituted of the PMOS transistors P1 and PV1 and the NMOS transistor N1, while the second inverter is constituted of the PMOS transistors P2 and PV2 and the NMOS transistor N2, so that the duty ratio is adjusted using the PMOS transistors PV1 and PV2.

Specifically, in the first inverter, the source of the PMOS transistor P1 is connected to the power-supply voltage VPERD, and the gate thereof receives the clock signal DLCLKA. The source of the PMOS transistor PV1 is connected to the drain of the PMOS transistor P1, and the gate thereof receives the control signal DCCINC from the bias circuit 16. The drain of the NMOS transistor N1 is connected to the drain of the PMOS transistor PV1, the gate thereof receives the clock signal DLCLKA, and the source thereof is connected to the ground potential VSS. In the second inverter, the source of the PMOS transistor P2 is connected to the power-supply voltage VPERD, and the gate thereof is connected to the drain of the PMOS transistor PV1. The source of the PMOS transistor PV2 is connected to the drain of the PMOS transistor P2, and the gate thereof receives the control signal DCCDEC from the bias circuit 15. The drain of the NMOS transistor N2 is connected to the drain of the PMOS transistor PV2, the gate thereof is connected to the drain of the PMOS transistor PV1, and the source thereof is connected to the ground potential VSS.

In the above, the output terminal of the first inverter corresponds to the connection point between the drain of the PMOS transistor PV1 and the drain of the NMOS transistor N1, while the output terminal of the second inverter corresponds to the connection point between the drain of the PMOS transistor PV2 and the drain of the NMOS transistor N2.

The first embodiment is characterized by that the MOS transistors, which are inserted into the first and second inverters in series in order to adjust the duty ratio of the clock signal DLCLKA, are each fixed to either N-channel MOS transistors or P-channel MOS transistors.

Figure 4B:
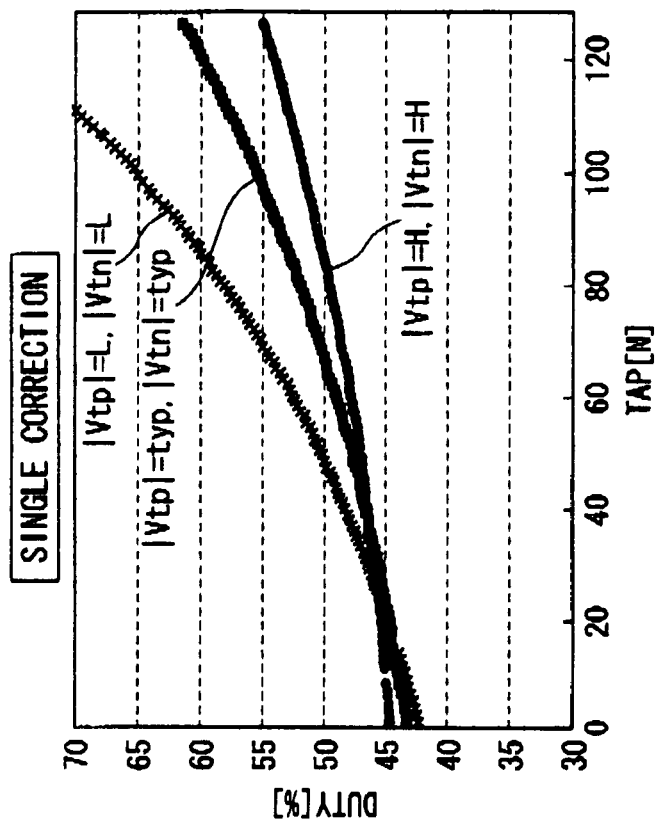
FIG. 4B is a graph showing simulation results on correcting duty ratios by way of single correction.
Figure 4A:
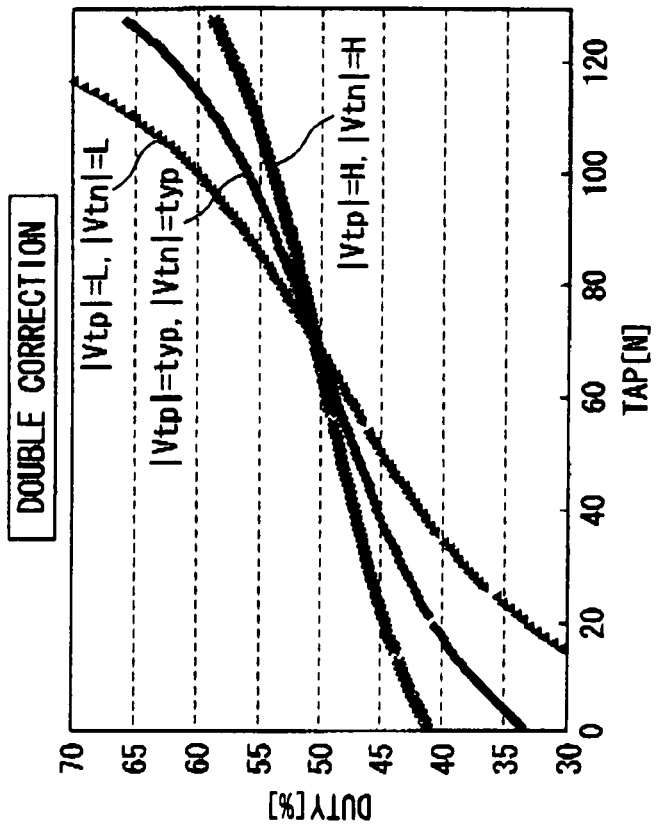
FIG. 4A is a graph showing simulation results on correcting duty ratios by way of double correction.

The duty correction circuit of the present embodiment is designed such that the bias voltage is approximately set to the power-supply voltage VPERD when the duty ratio is not subjected to the positive correction and the negative correction, wherein correctable ranges of positive and negative corrections are maintained irrespective of variations of manufacturing processes of semiconductor devices. This increase the correctable range of a double correction of FIG. 4A for increasing and decreasing the high-level period of the clock signal DLCLKAD. Unlike the present invention, the foregoing duty correction circuit is designed to perform a single correction of FIG. 4B for either increasing or decreasing the high-level period of the clock signal, wherein the correctable range of the duty ratio must be very narrow. In FIGS. 4A and 4B, the vertical axis represents the duty ratio while the horizontal axis represents an adjustment time designated by the control signal LSELF<7:0>.

The duty correction circuit of the present embodiment is designed to correct the duty ratio by way of multiple stages of delays, i.e. the three delay circuits 12, 13, and 14, wherein one stage of delay is reduced in the correction value (i.e. the delay time) so as to improve the correction precision. Since the overall correction value (or overall delay time) is formed using multiple stages of delays, it is possible to secure a broad correctable range for correcting the high-level period of the clock signal from its minimum value to the maximum value.

Since the duty correction circuit of the present embodiment adjusts the duty ratio of the clock signal DLCLKAD by varying bias voltages supplied to the NMOS transistors NV1 and NV2, it is possible to eliminate a negative influence due to switching skews occurring in switching transistors, and it is possible to easily set up variations of bias voltages, thus improving the correction precision for the duty ratio.

2. Second Embodiment

Next, a duty correction circuit according to a second embodiment of the present invention will be described with reference to FIGS. 5, 6, and 7.

Figure 5:
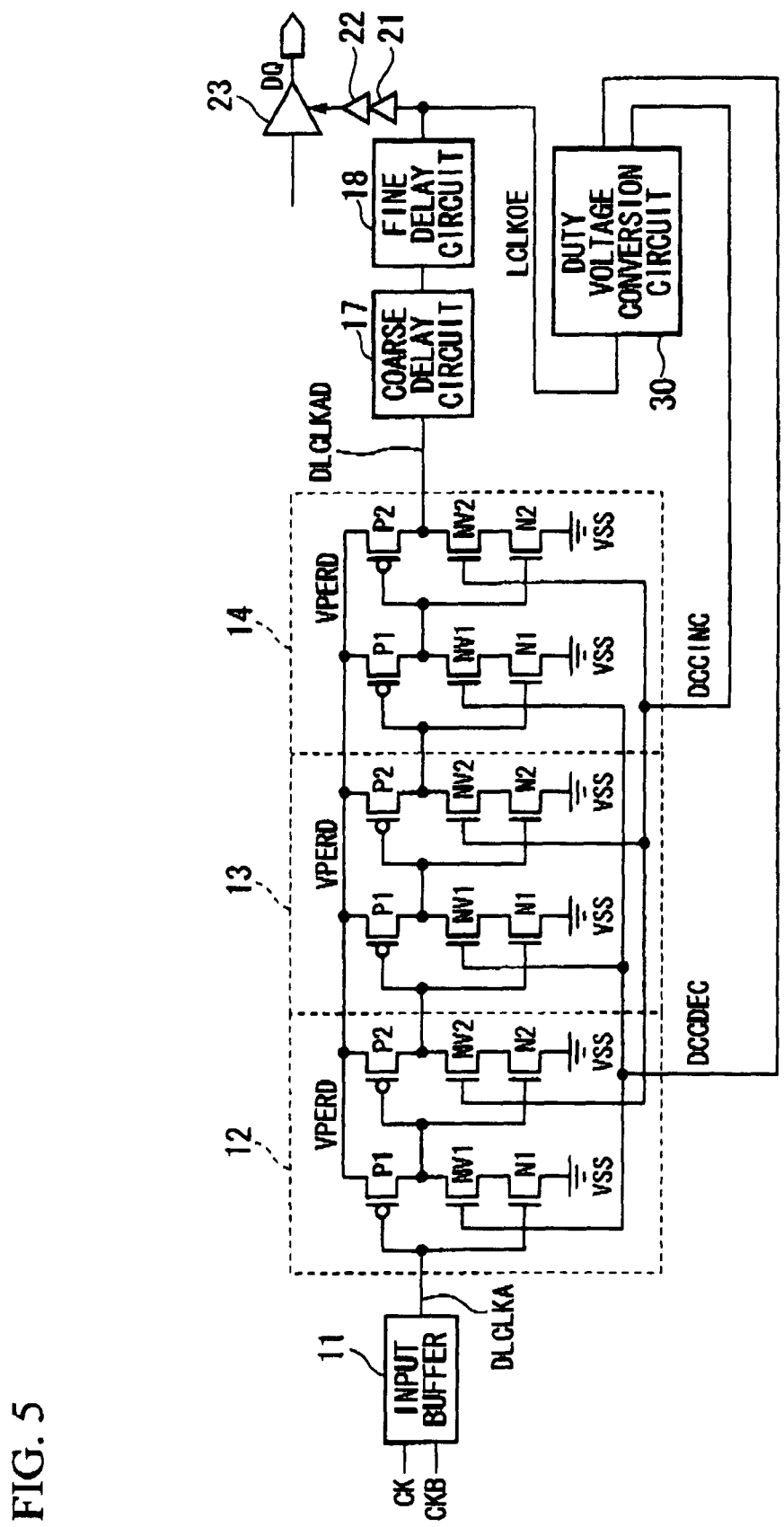
FIG. 5 is a block diagram showing the constitution of a duty correction circuit according to a second embodiment of the present invention.
Figure 6:
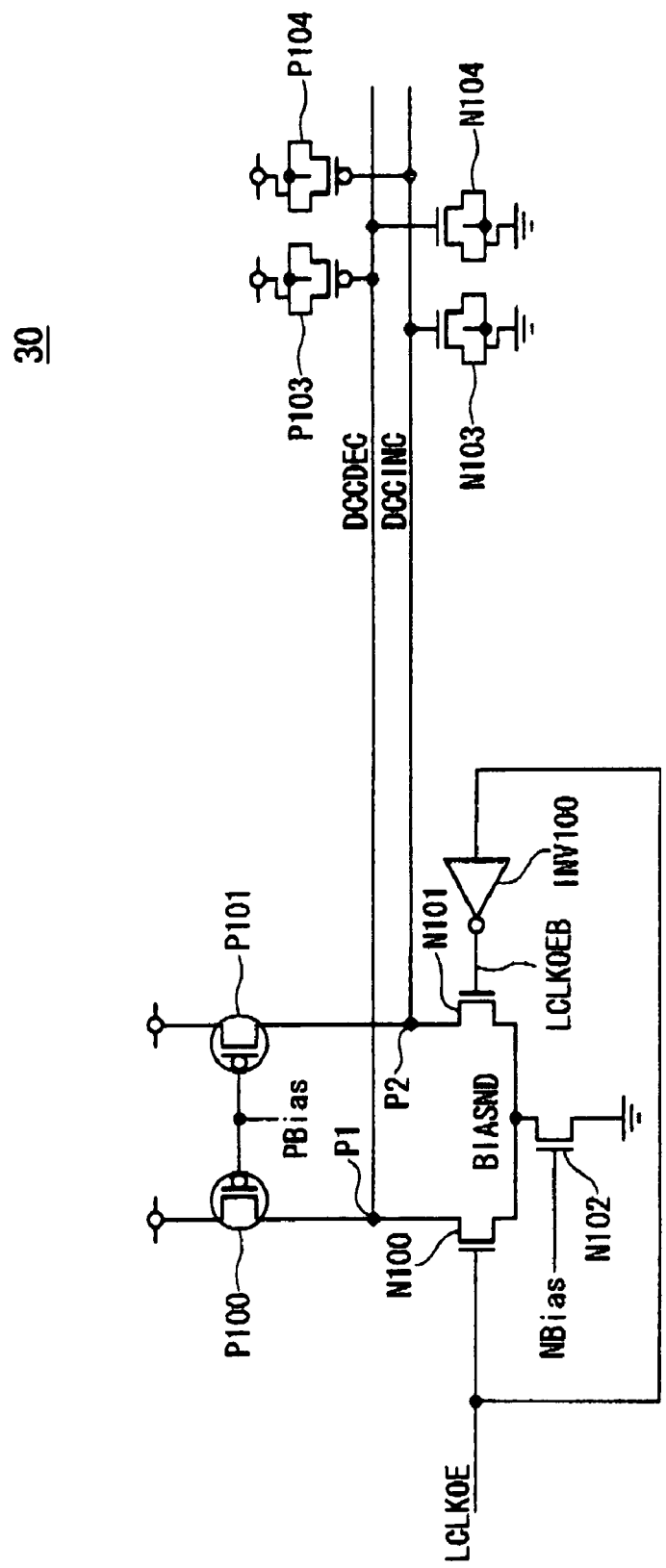
FIG. 6 is a circuit diagram showing the constitution of a duty voltage conversion circuit included in the duty correction circuit shown in FIG. 5.

FIG. 5 is a block diagram showing the duty correction circuit of the second embodiment, wherein parts identical to those shown in FIG. 1 are designated by the same reference numerals; hence, the following description refers to only the technical difference between the first embodiment of FIG. 1 and the second embodiment of FIG. 5.

The duty correction circuit of FIG. 5 includes a duty voltage conversion circuit 30 in addition to the input buffer 11, the delay circuits 12, 13, and 14, the coarse delay circuit 17, and the fine delay circuit 18.

The second embodiment differs from the first embodiment by the duty voltage conversion circuit 30, details of which will be described with reference to FIGS. 6 and 7. FIG. 6 is a circuit diagram of the duty voltage conversion circuit 30; and FIG. 7 shows waveforms of signals used for explaining the operation of the duty voltage conversion circuit 30, wherein the vertical axis represents the signal intensity while the horizontal axis represents the time.

The clock signal LCLKOE output from the fine delay circuit 18 is supplied to the duty voltage conversion circuit 30, which thus produces the control signals DCCDEC and DCCINC having the bias voltage VDEC and VINC for the delay circuits 12, 13, and 14.

The duty voltage conversion circuit 30 is constituted of PMOS transistors P100, P101, P103, and P104, NMOS transistors N100, N101, N102, N103, and N104, and an inverter INV100.

The source of the PMOS transistor P100 is connected to the power-supply voltage VPERD, and the gate thereof receives a bias signal PBias.

The source of the PMOS transistor P101 is connected to the power-supply voltage VPERD, and the gate thereof receives the bias signal PBias.

The drain of the NMOS transistor N100 is connected to a connection point P1 with the drain of the PMOS transistor P100, and the gate thereof receives the clock signal LCLKOE.

The drain of the NMOS transistor N101 is connected to a connection point P2 with the drain of the PMOS transistor P101, and the gate thereof receives an inverse clock signal LCLKOEB output from the inverter INV100 inverting the clock signal LCLKOE.

The voltage of the bias signal PBias is set to "VPERD–Vtp–$\alpha$", by which the PMOS transistors P100 and P101 are turned on to allow a prescribed current I to flow therethrough. Herein, Vtp denotes a threshold voltage of the PMOS transistors P100 and P101; and $\alpha$ denotes a voltage allowing the current I1 to flow through the PMOS transistors P100 and P101.

The voltage of a bias signal Nbias supplied to the gate of the NMOS transistor N102 is set to "Vtn+$\alpha$", by which the NMOS transistors N100 and N101 are turned on to allow a prescribed current I2 to flow therethrough. Herein, Vtn denotes a threshold voltage of the NMOS transistors N100 and N101; and α denotes a voltage allowing the current I2 to flow through the NMOS transistors N100 and N101.

The inverter INV100 inverts the phase of the clock signal LCLKOE so as to produce the inverse clock signal LCLKOEB.

The drain of the NMOS transistor N102 is connected to the sources of the NMOS transistors N100 and N101, and the source thereof is connected to the ground.

The PMOS transistor P103 serves as a capacitor connection such that the source and drain thereof are connected to the power-supply voltage VPERD, and the gate thereof is connected to the connection point P1.

The PMOS transistor P104 serves as a capacitor connection such that the source and drain thereof are connected to the power-supply voltage VPERD, and the gate thereof is connected to the connection point P2.

The NMOS transistor N103 serves as a capacitor connection such that the source and drain thereof are connected to the ground, and the gate thereof is connected to the connection point P2.

The NMOS transistor N104 serves as a capacitor connection such that the source and drain thereof are connected to the ground, and the gate thereof is connected to the connection point P1.

Next, the operation of the duty voltage conversion circuit 30 will be described in detail with reference to FIGS. 5, 6, and 7.

A constant current source is formed using the PMOS transistors P100 and P101 and the NMOS transistor N102, whereby electric charge accumulated by a first transistor pair consisting of the PMOS transistor P103 and the NMOS transistor N104 (both connected to the connection point P1) is varied in response to the gate voltage of the NMOS transistor N100, while electric charge accumulated by a second transistor pair consisting of the PMOS transistor P104 and the NMOS transistor N103 (both connected to the connection point P2) is varied in response to the gate voltage of the NMOS transistor N101. In this connection, the clock signal LCLKOE is supplied to the gate of the NMOS transistor N100, while the inverse clock signal LCLKOEB (output from the inverter INV100) is supplied to the gate of the NMOS transistor N101. That is, the NMOS transistors N100 and N101 are alternately turned on so as to alternately charge the first transistor pair consisting of P103 and N104 and the second transistor pair consisting of P104 and N103.

When the duty ratio of the clock signal LCLKOE is 50%, the same electric charge is accumulated by the first transistor pair consisting of P103 and N104 and the second transistor pair consisting of P104 and N103, wherein the bias voltage VDEC of the control signal DCCDEC is equal to the bias voltage VINC of the control signal DCCINC so that none of the positive correction and the negative correction is performed on the high-level period of the clock signal LCLKOE.

Figure 7:
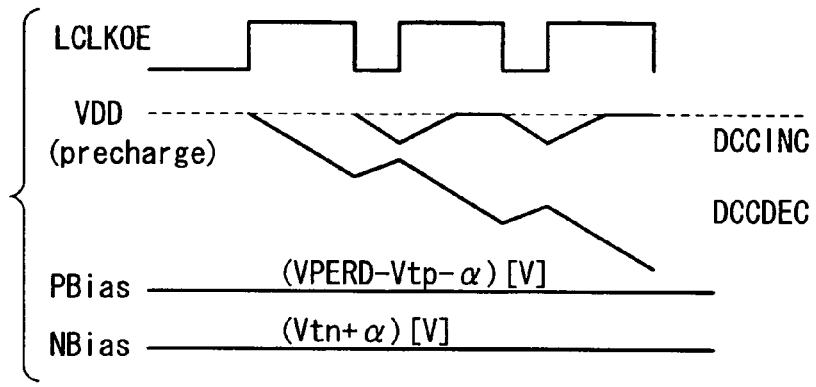
FIG. 7 shows waveforms of signals used for explaining the operation of the duty voltage conversion circuit of FIG. 6.
Figure 8:
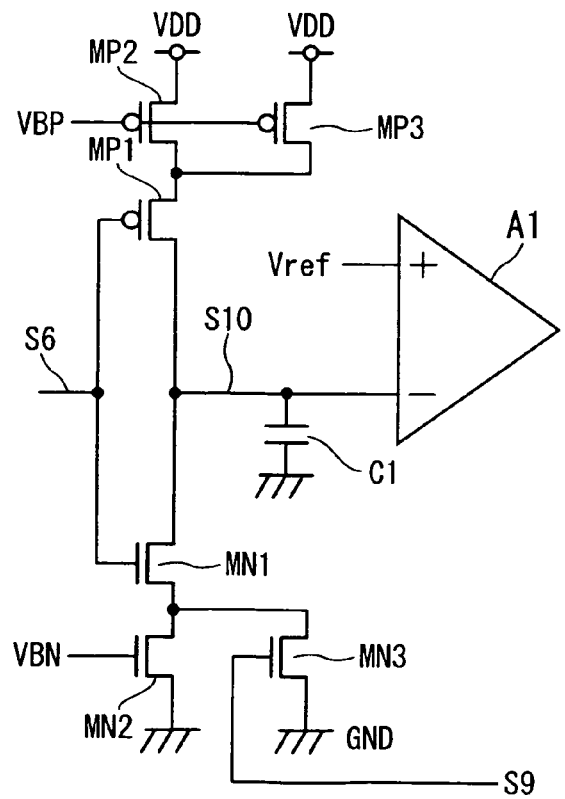
FIG. 8 is a circuit diagram showing the constitution of a timing control circuit incorporated in the foregoing duty ratio correction circuit.

When the high-level period of the clock signal LCLKOE is longer than the low-level period thereof as shown in FIG. 7, the bias voltage VDEC applied to the first transistor pair consisting of P103 and N104 becomes lower than the bias voltage VINC applied to the second transistor pair consisting of P104 and N103 so that the currents flowing through the NMOS transistors NV1 (included in the first inverters of the delay 12-14) become lower than the currents flowing through the NMOS transistors NV2 (included in the second inverters of the delay circuits 12-14), thus achieving the negative correction of FIG. 3C on the clock signal LCLKOE.

When the high-level period of the clock signal LCLKOE is shorter than the low-level period thereof, the bias voltage VDEC applied to the first transistor pair consisting of P103 and N104 becomes higher than the bias voltage VINC applied to the second transistor pair consisting of P104 and N103 so that the currents flowing through the NMOS transistors NV1 become higher than the currents flowing through the NMOS transistors NV2, thus achieving the positive correction of FIG. 3B on the clock signal LCLKOE.

Similar to the first embodiment, the second embodiment is designed such that the adjustment times for the positive and negative corrections are each varied dependent upon the difference voltage between the bias voltage VDEC of the control signal DCCDEC and the bias voltage VINC of the control signal DCCINC. However, the second embodiment has a simpler constitution compared with the first embodiment.

Lastly, it is apparent that the present invention is not limited to the above embodiments, but may be modified and changed without departing from the scope and spirit of the invention.

What is claimed is:

1. A duty correction circuit comprising:
   a first inverter including a first transistor, and second and third transistors having a conduction type which is different from a conduction type of the first transistor, wherein the first transistor whose gate receives an input clock signal is connected between a first voltage and a first output terminal, the second transistor whose gate receives the input clock signal is connected to a second voltage, and the third transistor is connected in series to the first transistor in connection with the first output terminal;
   a second inverter including a fourth transistor, and fifth and sixth transistors having a conduction type which is different from a conduction type of the fourth transistor, wherein the fourth transistor whose gate is connected to the first output terminal is connected between the first voltage and a second output terminal, the fifth transistor whose gate is connected to the first output terminal is connected to the second voltage, and the sixth transistor is connected in series to the fourth transistor in connection with the second output terminal; and
   a bias circuit that supplies a first bias voltage to a gate of the third transistor and that supplies a second bias voltage to a gate of the sixth transistor,
   wherein the input clock signal is delayed by the first inverter and the second inverter in turn and is converted into an output clock signal, whose duty ratio is corrected based on the first bias voltage or the second bias voltage and which is output from the second output terminal.

2. The duty correction circuit according to claim 1, wherein each of the first transistor and the fourth transistor is of a first conduction type while each of the second transistor, the third transistor, the fifth transistor, and the sixth transistor is of a second conduction type, so that the first voltage corresponds to a power-supply voltage while the second voltage corresponds to a ground potential.

3. The duty correction circuit according to claim 1, wherein the bias circuit generates the first bias voltage and the second bias voltage in response to a control signal, which is created based on the output clock signal.

4. The duty correction circuit according to claim 1, further comprising a duty detection circuit detecting the duty ratio of the output clock signal, so that the bias circuit produces the first bias voltage and the second bias voltage for use in the third transistor and the sixth transistor based on a detection result of the duty detection circuit.

5. The duty correction circuit according to claim 1, wherein the third transistor adjusts one of a leading-edge timing and a trailing-edge timing based on the first bias voltage, while the sixth transistor adjusts the other of the leading-edge timing and the trailing-edge timing based on the second bias voltage.

6. The duty correction circuit according to claim 1, wherein the bias circuit comprises a first bias circuit which supplies the first bias voltage to the gate of the third transistor and a second bias circuit which supplies the second bias voltage to the gate of the sixth transistor.

7. The duty correction circuit according to claim 6, wherein the first and second bias circuits comprise:
   a plurality of AND circuits; and
   a plurality of transistor pairs including:
      a first transistor including a drain connected to the first voltage via a resistor and a gate connected to an output terminal of an AND circuit of the plurality of AND circuits; and
      a second transistor including a drain connected to a source of the first transistor, a gate connected to the drain of the second transistor, and a source connected to the second voltage.

8. The duty correction circuit according to claim 7, wherein the first and second bias voltages are selected by a select signal comprising a plurality of signal lines including a signal line which designates a select signal for activating one of the first bias circuit and the second bias circuit.

9. The duty correction circuit according to claim 7, wherein the plurality of transistor pairs comprise first and second transistor pairs, and a size of the first and second transistors is such that a ratio of a first current flowing through the first transistor pair to a second current flowing through the second transistor pair is 1:2.

10. The duty correction circuit according to claim 1, further comprising:
   a delay circuit including the first and second inverters in a double-stage configuration.

11. The duty correction circuit according to claim 10, wherein the delay circuit comprises a plurality of delay circuits.

12. The duty correction circuit according to claim 1, wherein a source of the first transistor is connected to the first voltage and a drain of the first transistor is connected to a drain of the third transistor, and a source of the fourth transistor is connected to the first voltage and a drain of the fourth transistor is connected to a drain of the sixth transistor.

13. The duty correction circuit according to claim 12, wherein a source of the third transistor is connected to a drain of the second transistor, and a source of the sixth transistor is connected to a drain of the fifth transistor.

14. A duty correction circuit comprising:
   a plurality of delay circuits which are coupled together in a cascade-connection manner so as to convert an input clock signal into an output clock signal;
   a duty detection circuit detecting a duty ratio of the output clock signal; and
   a bias circuit supplying a first bias voltage or a second bias voltage to each of the delay circuits based on a detection result of the duty detection circuit,
   wherein each of the delay circuits includes
      a first inverter including a first transistor, and second and third transistors having a conduction type which is different from the conduction type of the first transistor, wherein the first transistor whose gate receives the input clock signal is connected between a first voltage and a first output terminal, the second transistor whose gate receives the input clock signal is connected to a second voltage, and the third transistor is connected in series to the first transistor in connection with the first output terminal, and
      a second inverter including a fourth transistor, and fifth and sixth transistors having a conduction type which is different from the conduction type of the fourth transistor, wherein the fourth transistor whose gate is connected to the first output terminal is connected between the first voltage and a second output terminal outputting the output clock signal, the fifth transistor whose gate is connected to the first output terminal is connected to the second voltage, and the sixth transistor is connected in series to the fourth transistor in connection with the second output terminal,
   wherein the first bias voltage is supplied to a gate of the third transistor, while the second bias voltage is supplied to a gate of the sixth transistor, and
   wherein the input clock signal is sequentially delayed by each of the delay circuits and are converted into the output clock signal whose duty ratio is corrected based on the first bias signal or the second bias signal.

15. The duty correction circuit according to claim 14, wherein the third transistor adjusts one of a leading-edge timing and a trailing-edge timing based on the first bias voltage, while the sixth transistor adjusts the other of the leading-edge timing and the trailing-edge timing based on the second bias voltage.

16. A semiconductor device comprising:
   a duty correction circuit which comprises:
      a first inverter including a first transistor, and second and third transistors having a conduction type which is different from a conduction type of the first transistor, the first transistor including a gate which receives an input clock signal and being connected between a first voltage and a first output terminal, the second transistor including a gate which receives the input clock signal and being connected to a second voltage, and the third transistor being connected in series to the first transistor in connection with the first output terminal; and
      a second inverter including a fourth transistor, and fifth and sixth transistors having a conduction type which is different from a conduction type of the fourth transistor, the fourth transistor including a gate which is connected to the first output terminal and being connected between the first voltage and a second output terminal, the fifth transistor including a gate which is connected to the first output terminal and being connected to the second voltage, and the sixth transistor being connected in series to the fourth transistor in connection with the second output terminal,
   wherein a bias circuit of the duty correction circuit supplies a first bias voltage to a gate of the third transistor and supplies a second bias voltage to a gate of the sixth transistor, and
   wherein the input clock signal is delayed by the first inverter and the second inverter in turn and is converted into an output clock signal having a duty ratio which is corrected based on the first bias voltage or the second bias voltage and which is output from the second output terminal.

* * * * *